United States Patent
Ono et al.

(10) Patent No.: US 9,713,257 B2
(45) Date of Patent: Jul. 18, 2017

(54) SWITCH MODULE

(71) Applicant: Murata Manufacturing Co., Ltd., Nagaokakyo-shi, Kyoto-fu (JP)

(72) Inventors: Atsushi Ono, Nagaokakyo (JP); Takanori Uejima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 441 days.

(21) Appl. No.: 14/534,436

(22) Filed: Nov. 6, 2014

(65) Prior Publication Data

US 2015/0061406 A1    Mar. 5, 2015

Related U.S. Application Data

(63) Continuation of application No. PCT/JP2013/062808, filed on May 7, 2013.

(30) Foreign Application Priority Data

May 9, 2012    (JP) ................................ 2012-107309

(51) Int. Cl.
*H05B 37/02*    (2006.01)
*H05K 1/18*    (2006.01)
*H04B 1/00*    (2006.01)
*H05K 1/02*    (2006.01)

(52) U.S. Cl.
CPC ............ *H05K 1/18* (2013.01); *H04B 1/0057* (2013.01); *H01L 2223/6677* (2013.01); *H01L 2224/16227* (2013.01); *H01L 2924/15313* (2013.01); *H01L 2924/19105* (2013.01); *H05K 1/0215* (2013.01); *H05K 1/0298* (2013.01); *H05K 2201/10098* (2013.01); *Y10T 307/74* (2015.04)

(58) Field of Classification Search
USPC .......................... 327/564–566; 307/112–113
See application file for complete search history.

(56) References Cited

U.S. PATENT DOCUMENTS 9,263,780 B2 *    2/2016    Ono ........................ H01P 1/10
2005/0176380 A1    8/2005    Okabe et al.
2010/0157860 A1    6/2010    Hagiwara et al.

FOREIGN PATENT DOCUMENTS

| JP | 2004-128799 A | 4/2004 |
|---|---|---|
| JP | 2005-223582 A | 8/2005 |
| JP | 2005-277692 A | 10/2005 |
| JP | 2006-073673 A | 3/2006 |
| JP | 2008-010995 A | 1/2008 |
| JP | 2009-290897 A | 12/2009 |

OTHER PUBLICATIONS

Official Communication issued in International Patent Application No. PCT/JP2013/062808, mailed on Jun. 18, 2013.

* cited by examiner

*Primary Examiner* — An Luu
(74) *Attorney, Agent, or Firm* — Keating & Bennett, LLP

(57) ABSTRACT

A switch module includes a switch circuit, a chip device which is a coupler, a chip device that defines together with the coupler a common-terminal-side circuit, chip devices defining switching-terminal-side circuits, and a multilayer substrate. The multilayer substrate includes inner-layer ground electrodes. A first inner-layer ground electrode is closer to the chip device than a second inner-layer ground electrode and includes an opening arranged so as not to be superposed with the chip device when viewed in plan in the stacking direction of the multilayer substrate.

18 Claims, 11 Drawing Sheets

SWITCH MODULE

BACKGROUND OF THE INVENTION

1. Field of the Invention

The present invention relates to a switch module configured to receive and transmit a plurality of communication signals using a common antenna.

2. Description of the Related Art

In recent years, a communication apparatus has come to transmit and receive a plurality of communication signals in different frequency bands using a common antenna, as cellular phones and the like have come to use multiple bands (refer to, for example, Japanese Unexamined Patent Application Publication No. 2008-10995). As a result, a communication apparatus has increasingly utilized a switch module that connects a plurality of communication circuits to a common antenna through switching.

FIG. 6A is a block diagram illustrating a general circuit configuration of a switch module.

A front-end circuit FEC illustrated in FIG. 6A includes a switch circuit SW, a common-terminal-side circuit 104, and switching-terminal-side circuits 107A to 107H. The switch circuit SW is configured to be capable of switching among ports PIC11 to PIC18 so that one of them is connected to a common port PIC01. The common-terminal-side circuit 104, which is connected between an antenna and the common port PIC01 of the switch circuit SW, is configured to function as both an electrostatic damage protection circuit and a matching circuit in this case. The common-terminal-side circuit 104 may be configured as, for example, a coupler, a filter circuit, a stand-alone matching circuit, or a stand-alone electrostatic damage protection circuit, or as a complex circuit which is a combination of these functions. The switching-terminal-side circuits 107A to 107H are provided between the communication circuits of respective communication systems and the respective ports PIC11 to PIC18 of the switch circuit SW. Here, the switching-terminal-side circuit 107A is a low-band-side transmission filter, the switching-terminal-side circuit 107B is a high-band-side transmission filter, and the switching-terminal-side circuits 107C to 107H are transmission lines. Note that the switching-terminal-side circuits 107A to 107H may be configured as transmission filters, reception filters, duplexers, capacitors, transmission lines, and the like.

The front-end circuit FEC described above is usually formed as a switch module which includes a multilayer substrate. The circuit devices of the switch circuit SW, the circuit devices of the common-terminal-side circuit 104, the circuit devices of the switching-terminal-side circuits 107A to 107H, and the like are formed of surface-mount components which are surface-mounted on the multilayer substrate, electrode patterns which are formed on the top surface and the bottom surface of the multilayer substrate and inside the multilayer substrate, and the like.

FIG. 6B is a schematic sectional view of an existing configuration example of a switch module.

A switch module 101 illustrated in FIG. 6B forms the front-end circuit FEC and includes a multilayer substrate 111 and chip devices 121A to 121C. The multilayer substrate 111 includes connection wiring lines 112, an inner-layer ground electrode 113, device mounting electrodes 114, and external connection electrodes 115. The external connection electrodes 115 are electrodes for mounting the switch module 101 on an external substrate. The device mounting electrodes 114 are electrodes for mounting the chip devices 121A to 121C and are connected to the inner-layer ground electrode 113 and the external connection electrodes 115 through the connection wiring lines 112. The inner-layer ground electrode 113 is connected to a ground potential through the external connection electrode 115. Note that the chip device 121A is a circuit device which forms the switch circuit SW. The chip device 121B is a circuit device which forms the common-terminal-side circuit 104. The chip devices 121C are circuit devices which form the switching-terminal-side circuits 107A to 107H.

The switch module 101 with an existing configuration has the following problems.

First, undesired coupling through the inner-layer ground electrode 113 is generated within the common-terminal-side circuit 104 as a result of the chip device 121B forming the common-terminal-side circuit, and the connection wiring lines 112 connected to the chip device 121B being connected to or arranged close to the inner-layer ground electrode 113.

Second, as a result of the chip device 121C forming the switching-terminal-side circuit, and the connection wiring lines 112 connected to the chip device 121C being connected to or arranged close to the inner-layer ground electrode 113, undesired coupling through the inner-layer ground electrode 113 is generated between the chip device 121C and the chip device 121B connected to or arranged close to the inner-layer ground electrode 113.

These couplings, which degrade isolation characteristics among the chip devices, cause degradation in the characteristics of the front-end circuit FEC.

SUMMARY OF THE INVENTION

Hence, preferred embodiments of the present invention provide a switch module that significantly reduces or prevents generation of coupling through an inner-layer ground electrode and achieves favorable characteristics.

According to a preferred embodiment of the present invention, a switch module includes a multilayer substrate, a switch circuit, a common-terminal-side circuit, a plurality of switching-terminal-side circuits, and inner-layer ground electrodes.

The multilayer substrate includes a plurality of dielectric layers and a plurality of electrode layers stacked on top of one another. The switch circuit includes a common terminal and a plurality of switching terminals, and is configured to be capable of switching a switching terminal to be connected to the common terminal of the switch circuit. The common-terminal-side circuit is connected to the common terminal and includes a first circuit device. The plurality of switching-terminal-side circuits are respectively connected to the switching terminals of the switch circuit. Inner-layer ground electrodes are respectively provided on some of the electrode layers so as to be superposed with the switching-terminal-side circuits when viewed in plan in a stacking direction of the multilayer substrate. An inner-layer ground electrode closest to the first circuit device is arranged so as not to be superposed with the first circuit device when viewed in plan in the stacking direction of the multilayer substrate.

In this switch module, it is preferable that the inner-layer ground electrode closest to the first circuit device include a cut-out portion or an opening located in an area thereof superposed with the first circuit device when viewed in plan in the stacking direction of the multilayer substrate. Further, it is preferable that a via electrode connected to the inner-layer ground electrode be arranged in a region of the inner-layer ground electrode closest to the first circuit device, the region surrounding the area superposed with the first circuit device when viewed in plan in the stacking direction of the multilayer substrate.

With these configurations, the occurrence of the first circuit device being coupled to other common devices through the inner-layer ground electrode closest to the first circuit device is significantly reduced or prevented. As a result, generation of undesired coupling within the common-terminal-side circuit and generation of undesired coupling between the common-terminal-side circuit and the switching-terminal-side circuits are significantly reduced or prevented. Hence, degradation in the characteristics of the switch module is prevented.

In a switch module according to a preferred of the present invention, the first circuit device preferably a coupler including a main line and a sub line.

In this switch module, it is preferable that the via electrode connected to the inner-layer ground electrode be arranged between a wiring electrode connected to the main line and a wiring electrode connected to the sub line. In addition, it is preferable that the wiring electrode connected to the main line and the wiring electrode connected to the sub line be routed on respective electrode layers different from each other. Further, it is preferable that the inner-layer ground electrode be arranged between the electrode layer on which the wiring electrode connected to the main line is routed and the electrode layer on which the wiring electrode connected to the sub line is routed.

With these configurations, coupling between the main line and sub line of the coupler through the inner-layer ground electrode that is closest to the coupler, which is the first circuit device, is significantly reduced or prevented, such that degradation in the characteristics of the switch module is prevented.

In a switch module according to a preferred embodiment of the present invention, a second circuit device connected to the first circuit device preferably is provided.

In a switch module according to a preferred embodiment of the present invention, the second circuit device preferably is a matching circuit.

According to various preferred embodiments of the present invention, the inner-layer ground electrode closest to the first circuit device is not superposed with the first circuit device when viewed in plan in the stacking direction of the multilayer substrate. Hence, the occurrence of the common-terminal-side circuit being coupled to the switching-terminal-side circuit through the inner-layer ground electrode is significantly reduced or prevented. Further, generation of undesired coupling within the common-terminal-side circuit is significantly reduced or prevented. As a result, degradation in the characteristics of the switch module is prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Hereinafter, a switch module according to a first preferred embodiment of the present invention will be described with reference to FIG. 1A to FIG. 1D.

Figure 1A:
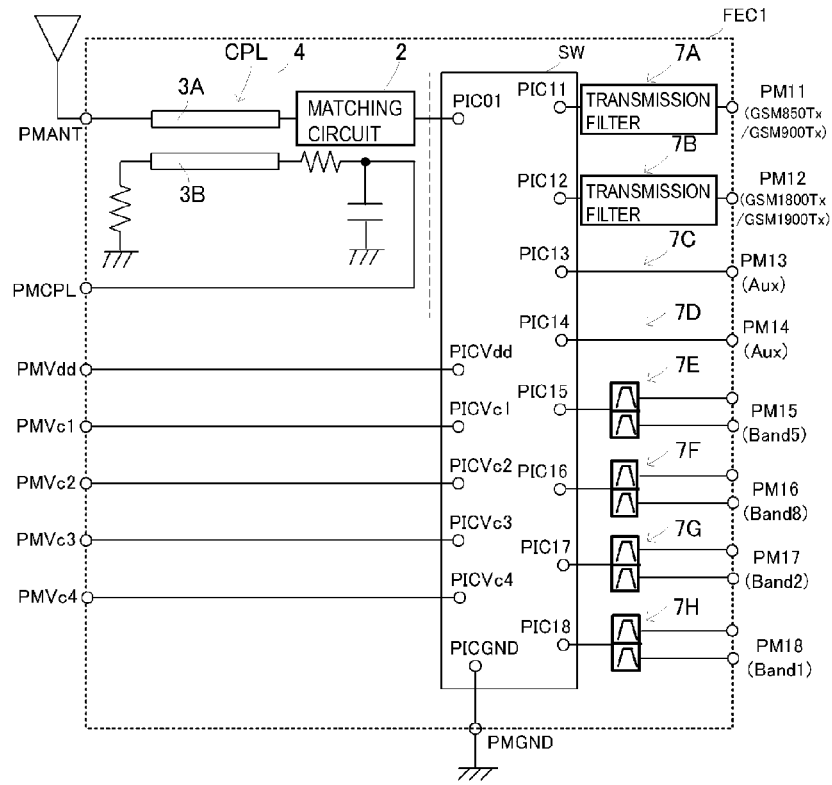
FIG. 1A is a block diagram illustrating the circuit configuration of a switch module according to a first preferred embodiment of the present invention.

FIG. 1A is a block diagram illustrating the circuit configuration of a first preferred embodiment of the present invention. A front-end circuit FEC1 illustrated in FIG. 1A includes a switch circuit SW, a common-terminal-side circuit 4, and switching-terminal-side circuits 7A to 7H.

The switch circuit SW includes a power supply port PICVdd, control ports PICVc1 to PICVc4, a common port PIC01, and switching ports PIC11 to PIC18. The power supply port PICVdd is a port to which a driving voltage of the switch circuit SW is applied. The control ports PICVc1-PICVc4 are ports to which respective control voltages are applied. The common port PIC01 is a port corresponding to the common terminal in the present preferred embodiment. The switching ports PIC11 to PIC18 are ports corresponding to the switching terminals in the present preferred embodiment.

The switch circuit SW is driven as a result of a driving voltage (Vdd) being applied to the power supply port PICVdd. The switch circuit SW, while being driven, as a result of control voltages (Vc1, Vc2, Vc3, and Vc4) being respectively applied to the control ports PICVc1, PICVc2, PICNc3, and PICVc4, connects one of the switching ports PIC11 to PIC18 to the common port PIC01 in accordance with the combination of the control voltages (Vc1, Vc2, Vc3, and Vc4).

The front-end circuit FEC1 includes external connection ports PMANT, PMCPL, PMVdd, PMVc1 to PMVc4, PM11 to PM18. The external connection port PMANT is a port through which an antenna signal flows. The external connection port PMCPL is a port through which a coupling signal flows. The external connection port PMVdd is a port to which a driving voltage (Vdd) is applied. The external connection ports PMVc1 PMVc4 are ports to which control signals (Vc1 to Vc4) are respectively applied. The external connection ports PM11 to PM18 are ports connected to a transmission system circuit, a reception system circuit, or a transmission/reception circuit.

The common-terminal-side circuit 4 is provided between the external connection ports PMANT and PMCPL and the common port PIC01. The common-terminal-side circuit 4 includes a matching circuit 2 and a coupler CPL. The matching circuit 2 is a circuit configured to perform impedance matching between the external connection port PMANT side and the common port PIC01 side. The coupler CPL includes a main line 3A and a sub line 3B coupled to the main line 3A. The two terminals of the main line 3A are respectively connected to the matching circuit 2 and the external connection port PMANT. One end of the sub line 3B is grounded through a termination resistor and the other end thereof is connected to the external connection port PMCPL through an attenuator.

The switching-terminal-side circuit 7A is configured as a transmission filter connected between the external connection port PM11 and the switching port PIC11. The switching-terminal-side circuit 7A allows a GSM (registered trademark) 850 transmission signal or a GSM (registered trademark) 900 transmission signal to pass therethrough, and attenuates the harmonics of these transmission signals.

The switching-terminal-side circuit 7B is configured as a transmission filter connected between the external connection port PM12 and the switching port PIC12. The switching-terminal-side circuit 7B allows a GSM (registered trademark) 1800 transmission signal or a GSM (registered trademark) 1900 transmission signal to pass therethrough, and attenuates the harmonics of these transmission signals.

The switching-terminal-side circuit 7C is connected between the external connection port PM13 and the switching port PIC13, and is configured as a transmission line. The switching-terminal-side circuit 7C is provided as a spare circuit and is capable of being used by connecting any circuit to the external connection port PM13.

The switching-terminal-side circuit 7D is connected between the external connection port PM14 and the switching port PIC14, and is configured as a transmission line. The switching-terminal-side circuit 7D is provided as a spare circuit and is capable of being used by connecting any circuit to the external connection port PM14.

The switching-terminal-side circuit 7E is configured as a duplexer connected between the external connection port PM15 and the switching port PIC15. The switching-terminal-side circuit 7E separates a transmission signal and a reception signal of a predetermined band class (Band 5) of a CDMA communication system and allows them to pass therethrough.

The switching-terminal-side circuit 7F is configured as a duplexer connected between the external connection port PM16 and the switching port PIC16. The switching-terminal-side circuit 7F separates a transmission signal and a reception signal of a predetermined band class (Band 8) of a CDMA communication system and allows them to pass therethrough.

The switching-terminal-side circuit 7G is configured as a duplexer connected between the external connection port PM17 and the switching port PIC17. The switching-terminal-side circuit 7G separates a transmission signal and a reception signal of a predetermined band class (Band 2) of a CDMA communication system and allows them to pass therethrough.

The switching-terminal-side circuit 7H is configured as a duplexer connected between the external connection port PM18 and the switching port PIC18. The switching-terminal-side circuit 7H separates a transmission signal and a reception signal of a predetermined band class (Band 1) of a CDMA communication system and allows them to pass therethrough.

The front-terminal circuit FEC1 is configured as a switch module 1 (reference symbol is not illustrated) which includes a multilayer substrate. The circuit devices of the switch circuit SW, the circuit devices of the common-terminal-side circuit 4, the circuit devices of the switching-terminal-side circuits 7A to 7H, and the like preferably are surface-mount components which are surface-mounted on the multilayer substrate, electrode patterns which are provided on the front surface and the bottom surface of the multilayer substrate and inside the multilayer substrate, and the like.

Figure 1B:
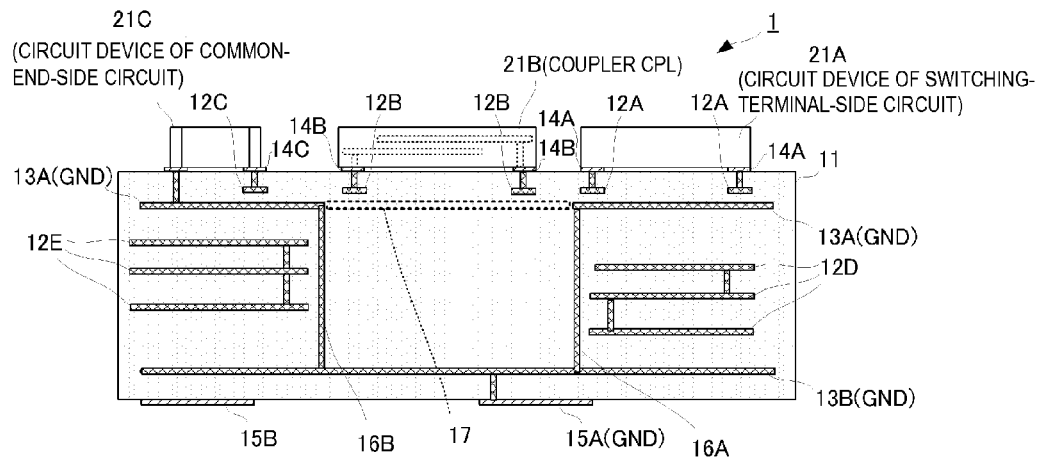
FIG. 1B is a schematic diagram illustrating the cross-sectional structure of the switch module according to the first preferred embodiment of the present invention.

FIG. 1B is a schematic diagram illustrating the cross-sectional configuration of the switch module according to the first preferred embodiment. The switch module 1 illustrated in FIG. 1B includes a multilayer substrate 11 and chip devices 21A to 21C.

The multilayer substrate 11 preferably is a low-temperature co-fired ceramic (LTCC) substrate including a plurality of ceramic layers and a plurality of electrode layers stacked on top of one another, and includes connection wiring lines 12A to 12E, inner-layer ground electrodes 13A and 13B, device mounting electrodes 14A to 14C, external connection electrodes 15A and 15B, and ground connection via electrodes 16A and 16B.

The external connection electrodes 15A and 15B are electrodes configured to mount the switch module 1 on an external substrate and also function as external connection ports. Specifically, the external connection electrode 15A is an external connection port connected to a ground potential. The component mounting electrodes 14A to 14C are electrodes configured to mount chip devices 21A to 21C, and are connected to the external connection electrodes 15A and 15B through the connection wiring lines 12A to 12E, the inner-layer ground electrodes 13A and 13B, and the ground connection via electrodes 16A and 16B. The inner-layer ground electrodes 13A and 13B are connected to each other through the ground connection via electrodes 16A and 16B, and are connected to the ground potential through the external connection electrode 15A. The chip devices 21A are circuit devices such as duplexers 6A to 6D, chip resistors, chip inductors, chip capacitors, and the like which form the switching-terminal-side circuits 7A to 7H. The chip device 21B is the coupler CPL housing the main line and the sub line. The chip devices 21C are circuit devices, such as a matching circuit, a termination resistor, an attenuator, and the like, which are connected to the coupler CPL and define a portion of the common-terminal-side circuit 4. Although not illustrated in FIG. 1B, a switch IC forming the switch circuit SW is also mounted on the device mounting surface of the multilayer substrate 11.

Here, the inner-layer ground electrode 13A is provided on an electrode layer near the chip device 21B that defines and serves as the coupler CPL and the connection wiring lines 12B connected to the chip device 21B. The inner-layer ground electrode 13A is arranged over nearly the whole surface of the electrode layer except for an opening 17 provided in an area superposed with the chip device 21B when viewed in plan in the stacking direction of the multi-layer substrate 11. In other words, the inner-layer ground electrode 13A is superposed with the chip devices 21A, which are the circuit devices of the switching-terminal-side circuits, and the chip devices 21C, which are the second circuit devices, defining a portion of the common-terminal-side circuit, and in such a manner as not to be superposed with the chip device 21B, which is the first circuit device, defining a portion of the common-terminal-side circuit.

Hence, the occurrence of the main line 3A and the sub line 3B of the coupler CPL being coupled to each other through the inner-layer ground electrode 13A becomes very unlikely. Note that the inner-layer ground electrode 13B provided on a layer below the inner-layer ground electrode 13A does not have an opening formed therein and faces the chip device 21B, but since the inner-layer ground electrode 13B is provided on an electrode layer located at a position spaced apart from the chip device 21B, coupling between the main line 3A and the sub line 3B of the coupler CPL and the inner-layer ground electrode 13B is very weak, an increase in the degree of coupling between the main line 3A and the sub line 3B due to the existence of the inner-layer ground electrode 13B is very unlikely to occur. For a similar reason, the occurrence of the coupler CPL being coupled to other circuit devices (for example, the switching-terminal-side circuits 7A to 7H) through the inner-layer ground electrode 13A also becomes very unlikely. As a result, the switch module 1 achieves favorable characteristics.

Further, here, the ground connection via electrodes 16A and 16B which connect the inner-layer ground electrode 13A and the inner-layer ground electrode 13B to each other are connected to the inner-layer ground electrode 13A in the area surrounding the opening 17, extend from positions at which they are connected to the inner-layer ground electrode 13A in the stacking direction of the multilayer substrate 11, and are connected to the inner-layer ground electrode 13B.

As a result, coupling of the chip device 21B at a location facing the opening 17 to the wiring electrodes 12D and 12E with the ground connection via electrodes 16A and 16B therebetween is significantly reduced or prevented. In other words, coupling between the coupler CPL and circuit devices (for example, circuit devices of the switching-terminal-side circuits and the second circuit devices defining a portion of the common-terminal-side circuit) connected to the wiring electrodes 12D and 12E is significantly reduced or prevented, thus effectively preventing the coupling between the main line 3A and the sub line 3B of the coupler CPL and the coupling between the coupler CPL and the switching-terminal-side circuits 7A to 7H.

Figure 1C:
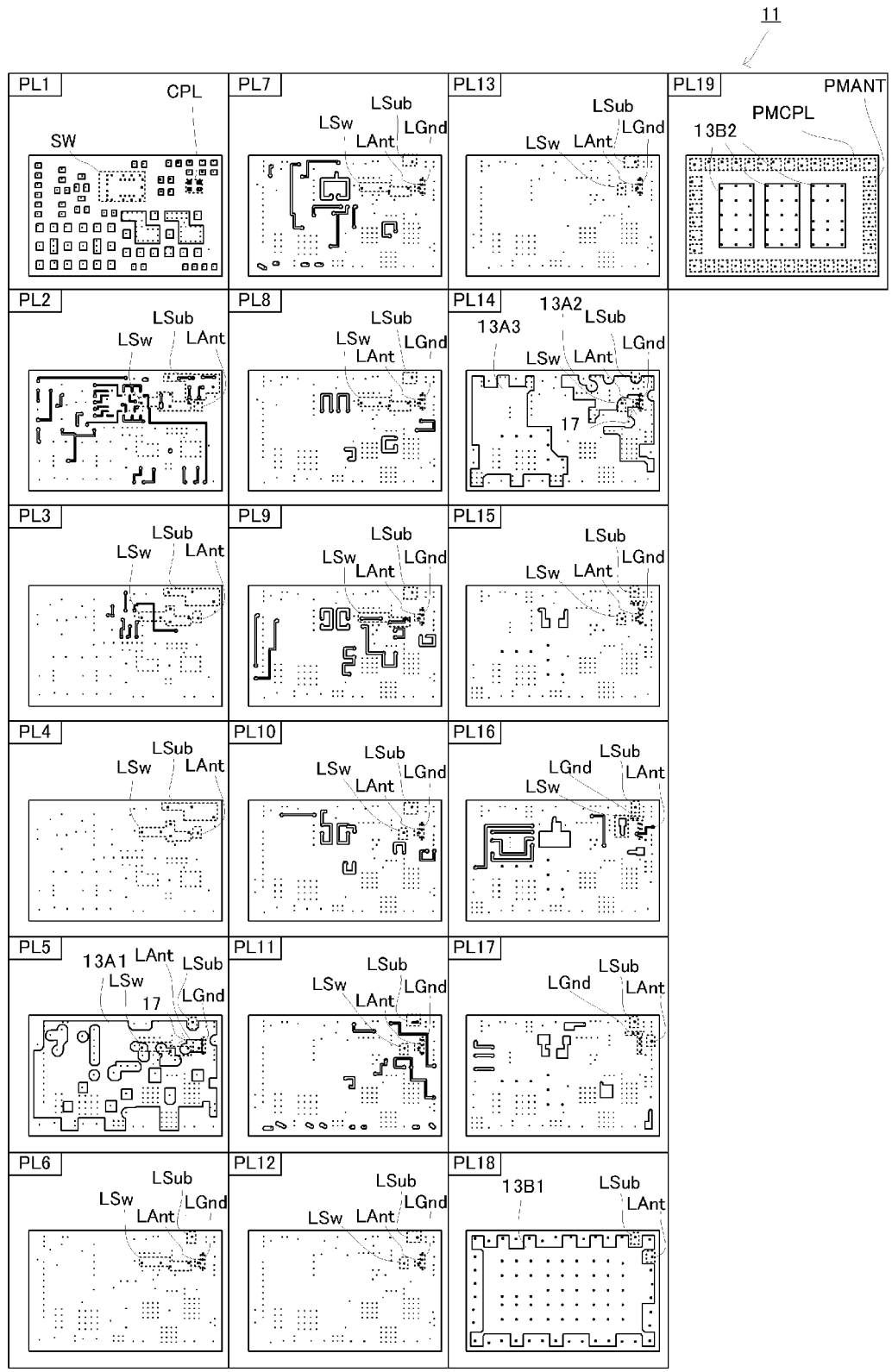
FIG. 1C is a stacking diagram according to an example of the switch module according to the first preferred embodiment of the present invention.

Next, a specific non-limiting example of the switch module 1 will be described. FIG. 1C is a stacking diagram of the multilayer substrate 11 according to an example of the switch module 1. Note that the multilayer substrate 11 illustrated here is formed by stacking 19 layers of ceramic layers (dielectric layers) on top of one another. Predetermined electrode patterns are formed on the upper surface or the lower surface of each dielectric layer, and via electrodes for interlayer connection are formed within each dielectric layer. The via electrodes are denoted by small circles in the figure. In the descriptions below, it is assumed that the uppermost dielectric layer is a dielectric layer PL1 and the lowermost dielectric layer is a dielectric layer PL19, where the numeral in the layer reference increases as the layer level decreases.

On the top surface of the dielectric layer PL1, which is located on the uppermost layer of the multilayer substrate 11, a plurality of device mounting electrodes are formed. A plurality of chip devices are mounted on the device mounting electrodes. As the chip devices, the following circuit devices which form the front-end circuit FEC1 are used: the coupler CPL, the switch circuit SW, duplexers which form the switching-terminal-side circuits 7E to 7H, the switching-terminal-side circuits 7A and 7B; and chip resistors, chip inductors, chip capacitors, and the like which form the matching circuit 2, the attenuator, the termination resistor, and the like.

On the dielectric layers PL2 and PL3 located on the second and third layers of the multilayer substrate 11, a plurality of pattern electrodes and a plurality of via electrodes are formed. These pattern electrodes are used to connect device mounting electrodes to internal wiring lines.

On the dielectric layer PL4 located on the fourth layer of the multilayer substrate 11, a plurality of via electrodes are formed.

On the dielectric layer PL5 located on the fifth layer of the multilayer substrate 11, an inner-layer ground electrode 13A1 and a plurality of via electrodes are formed. The inner-layer ground electrode 13A1 is configured to prevent the pattern electrodes on the dielectric layers PL2 and PL3 from being coupled to the electrodes on the dielectric layers PL6 to PL13. The inner-layer ground electrode 13A1 includes an opening 17 in an area superposed with a chip device which is the coupler CPL when the multilayer substrate 11 is viewed in plan in the stacking direction thereof.

On the dielectric layer PL6 located on the sixth layer of the multilayer substrate 11, a plurality of via electrodes are formed.

On the dielectric layers PL7 to PL11 located on the seventh layer to the eleventh layer of the multilayer substrate 11, a plurality of pattern electrodes and a plurality of via electrodes are formed. These are mainly used to form inductors.

On the dielectric layers PL12 and PL13 located on the twelfth layer to the thirteenth layers of the multilayer substrate 11, a plurality of via electrodes are formed.

On the dielectric layer PL14 located on the fourteenth layer of the multilayer substrate 11, inner-layer ground electrodes 13A2 and 13A3 and a plurality of via electrodes are formed. The inner-layer ground electrodes 13A2 and 13A3 are formed so as to be spaced apart from each other, and are provided to prevent the electrodes on the dielectric layers PL6 to PL13 from being coupled to the electrodes on the dielectric layers PL15 to PL17. The inner-layer ground electrode 13A2 includes an opening 17 provided in an area thereof superposed with the chip device that serves as the coupler CPL when the multilayer substrate 11 is viewed in plan in the stacking direction thereof.

On the dielectric layers PL15 to PL17 located on the fifteenth layer to the seventeenth layer of the multilayer substrate 11, a plurality of pattern electrodes and a plurality of via electrodes are formed. These are mainly used to form capacitors.

On the dielectric layer PL18 located on the eighteenth layer of the multilayer substrate 11, an inner-layer ground electrode 13B1 and a plurality of via electrodes are formed. The inner-layer ground electrode 13B1 is provided to prevent the electrodes on the dielectric layers PL15 to PL17 from coupling to an electrode which is used for an external connection port of the dielectric layer PL19, and is formed over approximately the whole surface of the dielectric layer PL18 excluding the peripheral portion.

On the dielectric layer PL19 located on the nineteenth layer of the multilayer substrate 11, an inner-layer ground electrode 13B2, a plurality of via electrodes, and a plurality of electrodes which are used for external connection ports are formed. The inner-layer ground electrode 13B2 is provided to prevent the electrodes which are used for external connection ports from coupling to one another.

The multilayer substrate 11 of the present example is formed by stacking the above-described dielectric layers PL1 to PL19 on top of one another. An antenna line LAnt, which is a wiring line connecting the coupler CPL to the external connection port PMANT, includes and is defined by via electrodes provided in the dielectric layers PL1 to PL15, pattern wiring lines provided on the dielectric layer PL16, and via electrodes provided in the dielectric layers PL16 to PL19.

A switching line LSw, which is a wiring line that connects the coupler CPL to the switch circuit SW through the matching circuit 2, includes via electrodes provided in the dielectric layers PL1 to PL8, pattern wiring lines provided on the dielectric layer PL9, and via electrodes provided in the dielectric layers PL9 to PL16.

A sub-line wiring line Lsub, which is a wiring line connected to the sub line 3B of the coupler CPL, includes a pattern wiring line provided on the dielectric layer PL2 and via electrodes provided in the dielectric layers PL3 to PL19.

A ground line LGnd configured to secure isolation includes via electrodes provided in the dielectric layers PL5 to PL17. The ground line LGnd configured to secure isolation is arranged along the peripheral portions surrounding the openings 17 provided in the inner-layer ground electrodes 13A1 and 13A2.

As described above, in the multilayer substrate 11 of the present example, the opening (cut-out portion) 17 facing the chip device that defines and serves as the coupler CPL is provided in each of the inner-layer ground electrodes 13A1 and 13A2 near the chip device that serves as the coupler CPL. As a result, coupling between the main line and the sub line of the coupler CPL through the inner-layer ground electrodes 13A1 and 13A2 and coupling between the coupler CPL and other circuit devices are significantly reduced or prevented.

The ground line LGnd configured to secure isolation is arranged in the peripheral portion surrounding the openings (cut-out portions) 17 using the ground connection via electrodes connecting the inner-layer ground electrodes 13A1 and 13A2 to each other. As a result, the occurrence of the coupler CPL being coupled to other circuit devices and wiring lines with the ground line LGnd therebetween is significantly reduced or prevented.

Further, the sub-line wiring line Lsub is routed mainly to a predetermined position using a pattern electrode provided on the top surface of the dielectric layer PL2, and includes via electrodes in other layers. On the other hand, the antenna line LAnt is routed mainly to a predetermined position provided on the top surface of the dielectric layer PL16, and includes via electrodes in other layers. The switching line LSw is routed mainly to a predetermined position using a pattern electrode provided on the top surface of the dielectric layer PL9 and includes via electrodes in other layers. In other words, the sub-line wiring line Lsub is routed on a layer higher than the inner-layer ground electrode 13A1, the antenna line LAnt is routed on a layer lower than the inner-layer ground electrodes 13A1 and 13A2, and the switching line LSw is routed on a layer lower than the inner-layer ground electrode 13A1 and higher than the inner-layer ground electrode 13A2. Hence, the routed portion of the switching line LSw, the routed portion of the antenna line LAnt, and the routed portion of the sub-line wiring line Lsub are arranged be significantly separated from one another in the stacking direction of the multilayer substrate 11, with the inner-layer ground electrodes 13A1 and 13A2 thereamong. As a result, the occurrence of coupling between the main line and the sub line of the coupler CPL through the routed portions is significantly reduced or prevented.

Figure 1D:
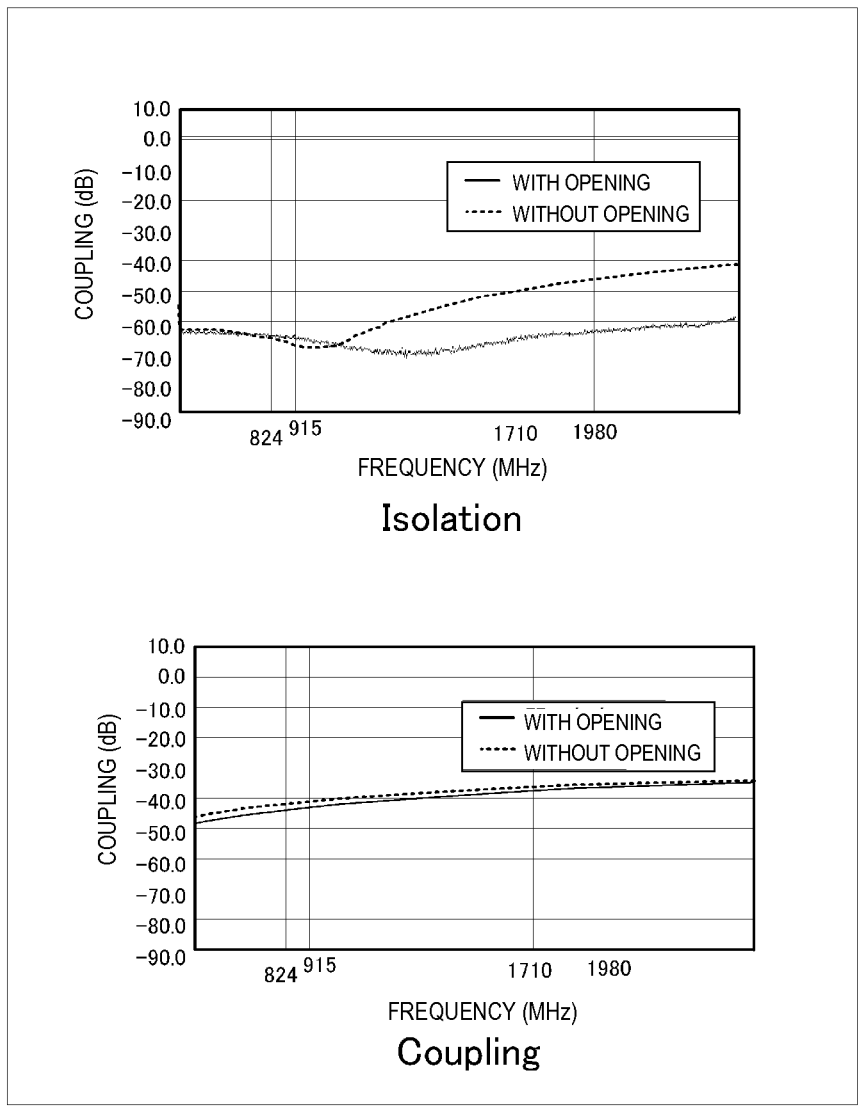
FIG. 1D is a characteristics diagram according to the example of the switch module according to the first preferred embodiment of the present invention.

FIG. 1D is a diagram illustrating coupler characteristics in the switch module according to the present example, and coupler characteristics in a comparative configuration. Note that the comparative switch module has a configuration in which the areas superposed with the coupler CPL in the inner-layer ground electrodes 13A1 and 13A2 are not made to be the openings (cut-out portions) 17, and in which the electrodes are provided.

Regarding the isolation characteristics of the configuration according to the present example, a coupling of, for example, about −60 dB or less is realized in the 824-915 MHz band. Further, a coupling of, for example, about −60 dB is realized also in the 1710-1980 MHz band. On the other hand, regarding the isolation characteristics of the comparative configuration, although a coupling of about −60 dB or less is realized in the 824-915 MHz band, the coupling exceeds about −50 dB and a coupling of about −60 dB is not realized in the 1710-1980 MHz band, for example. Note that regarding the coupling characteristics of the configuration according to the present example and the coupling characteristics of the comparative configuration, similar coupling levels are realized by the two configurations.

As can be seen from the above description, by respectively providing the openings 17 in the inner-layer ground electrodes 13A1 and 13A2 as in the configuration according to the present example, undesired coupling between the main line and the sub line is significantly reduced or prevented, thus realizing favorable isolation characteristics and directionality.

In particular, in the case where the main line 3A and the sub line 3B of the coupler CPL are coupled to each other, there is a tendency that the higher the frequency, the larger the coupling. However, it can be seen that with the configuration of the present preferred embodiment, by significantly reducing or preventing the coupling between the main line 3A and the sub line 3B of the coupler CPL, the directionality of the coupler CPL is ensured in a broad frequency band covering a range from a GSM (registered trademark) 850 communication system to a GSM (registered trademark) 1900 communication system.

Second Preferred Embodiment

Hereinafter, a switch module according to a second preferred embodiment of the present invention will be described with reference to FIG. 2A and FIG. 2B.

Figure 2A:
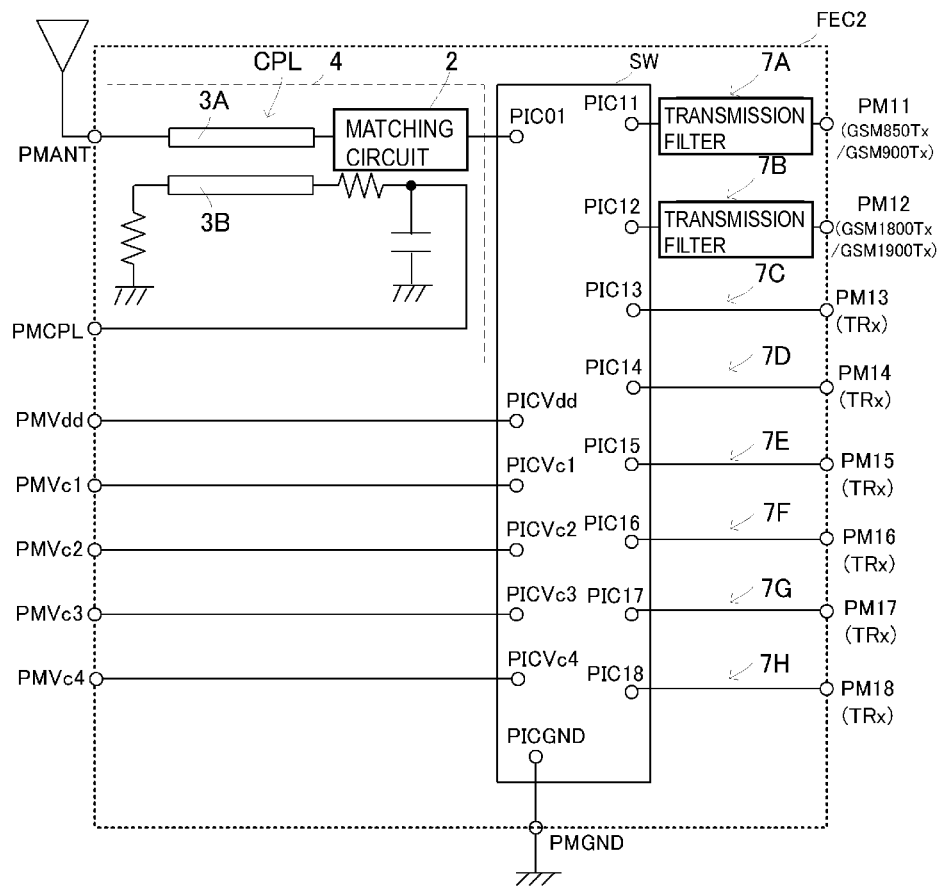
FIG. 2A is a block diagram illustrating the circuit configuration of a switch module according to a second preferred embodiment of the present invention.
Figure 2B:
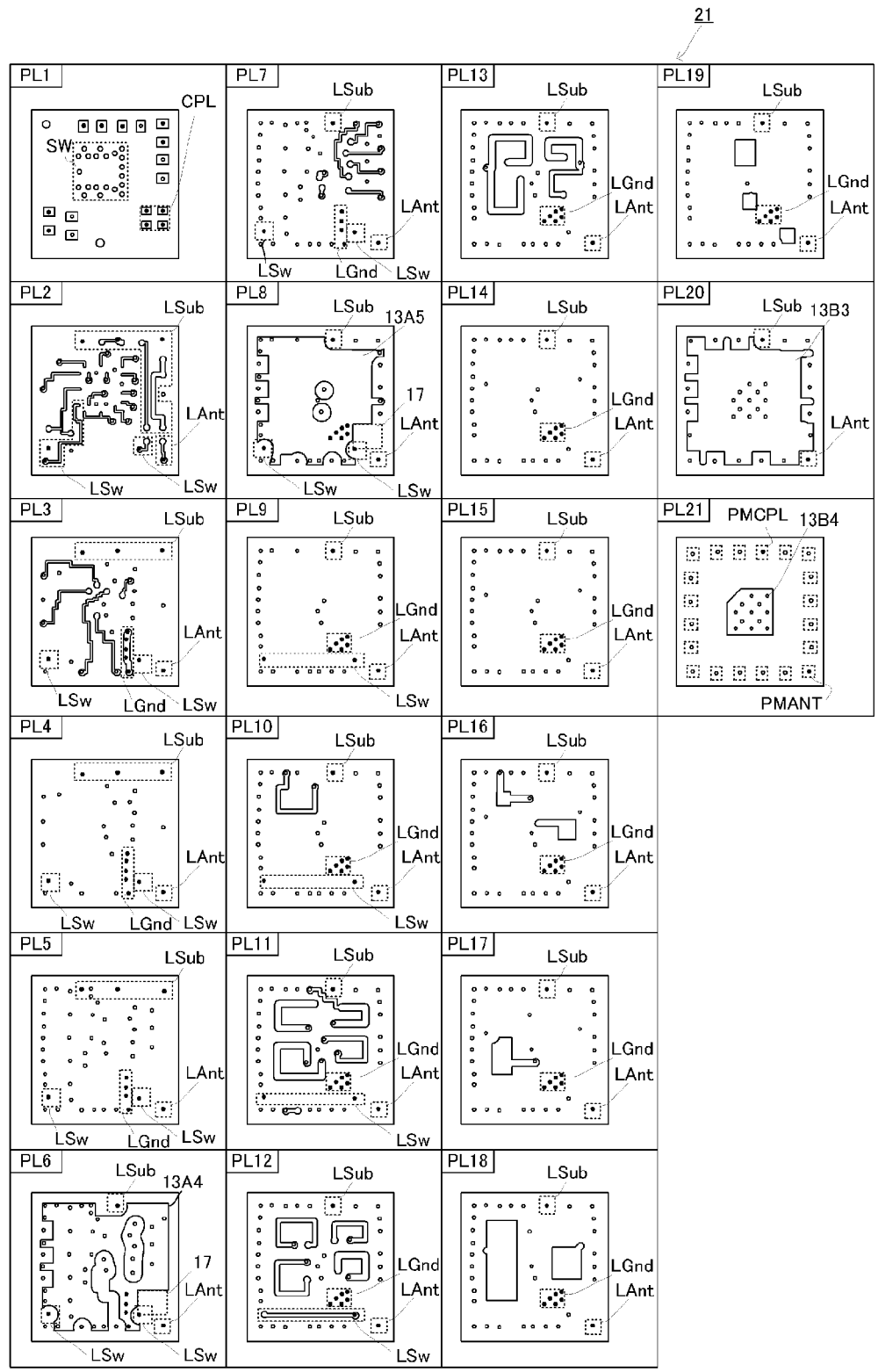
FIG. 2B is a stacking diagram according to an example of the switch module according to the second preferred embodiment of the present invention.

FIG. 2A is a block diagram illustrating the circuit configuration of a switching module according to the present preferred embodiment. A front-end circuit FEC2 illustrated in FIG. 2A includes a switch circuit SW, a common-terminal-side circuit 4, and switching-terminal-side circuits 7A to 7H. Note that the internal configurations of the switch circuit SW, the common-terminal-side circuit 4, and the switching-terminal-side circuits 7A and 7B are preferably the same as those of the front-end circuit FEC1 according to the first preferred embodiment and, hence, the descriptions thereof are omitted here. The front-end circuit FEC2 has a configuration in which the duplexers have been removed from the front-end circuit FEC1 of the first preferred embodiment and the switching-terminal-side circuits 7C to 7H include transmission lines.

The front-end circuit FEC2 preferably is a switching module which includes a multilayer substrate. A schematic diagram illustrating the cross-sectional configuration of this switch module is the same as that of the first preferred embodiment and, hence, the description thereof is omitted here.

Next, a specific example of the switch module will be described. FIG. 2B is a stacking diagram of a multilayer substrate 21 which defines a switch module according to the present example. Note that the multilayer substrate 21 illustrated here preferably includes 21 layers of ceramic layers (dielectric layers) stacked on top of one another.

On the top surface of a dielectric layer PL1, which is located on the uppermost layer of the multilayer substrate, a plurality of device mounting electrodes are provided. A plurality of chip devices are mounted on the device mounting electrodes. As the chip devices, the following circuit devices of the front-end circuit FEC2 are preferably used: a coupler CPL, the switch circuit SW, the switching-terminal-side circuits 7A and 7B; and chip resistors, chip inductors, chip capacitors, and the like which define a matching circuit 2, an attenuator, a termination resistor, and the like.

On dielectric layers PL2 and PL3 located on the second layer and the third layer of the multilayer substrate 21, a plurality of pattern electrodes and a plurality of via electrodes are provided. These pattern electrodes are configured to route wiring lines from the device mounting electrodes.

On dielectric layers PL4 and PL5 located on the fourth layer and the fifth layer of the multilayer substrate 21, a plurality of via electrodes are provided.

On a dielectric layer PL6 located on the sixth layer of the multilayer substrate 21, an inner-layer ground electrode 13A4 and a plurality of via electrodes are provided. The inner-layer ground electrode 13A4 is configured to prevent the pattern electrodes on the dielectric layers PL2 and PL3 from being coupled to the electrodes on a dielectric layer PL7. The inner-layer ground electrode 13A4 includes an opening 17 in an area thereof superposed with a chip device that defines and serves as the coupler CPL when the multilayer substrate 21 is viewed in plan in the stacking direction thereof.

On the dielectric layer PL7 located on the seventh layer of the multilayer substrate 21, a plurality of via electrodes and a plurality of via electrodes are provided. These pattern electrodes are configured to route wiring lines.

On a dielectric layer PL8 located on the eighth layer of the multilayer substrate 21, an inner-layer ground electrode 13A5, and a plurality of via electrodes are provided. The inner-layer ground electrode 13A5 is configured to prevent the dielectric layer PL7 from being coupled to the electrodes on the dielectric layers PL9 to PL19. The inner-layer ground electrode 13A5 includes an opening 17 provided in an area thereof superposed with a chip device that defines and serves as the coupler CPL when the multilayer substrate 21 is viewed in plan in the stacking direction thereof.

On a dielectric layer PL9 located on the ninth layer of the multilayer substrate 21, a plurality of via electrodes are provided.

On dielectric layers PL10 to PL13 located on the tenth layer to the thirteenth layer of the multilayer substrate 21, a plurality of pattern electrodes and a plurality of via electrodes are provided, which are configured to define inductors.

On dielectric layers PL14 and PL15 located on the 14th layer and the 15th layer of the multilayer substrate 21, a plurality of via electrodes are provided.

On dielectric layers PL16 to PL19 located on the 16th layer to the 19th layer of the multilayer substrate 21, a plurality of pattern electrodes and a plurality of via electrodes are provided, which are configured to define capacitors.

On a dielectric layer PL20 located on the 20th layer of the multilayer substrate 21, an inner-layer ground electrode 13B3 and a plurality of via electrodes are provided.

On a dielectric layer PL21 located on the 21st layer of the multilayer substrate 21, an inner-layer ground electrode 13B4, a plurality of via electrodes, and a plurality of electrodes which are configured to define external connection ports are provided.

The multilayer substrate 21 of the present example is formed preferably by stacking the above-described dielectric layers PL1 to PL21 on top of one another. An antenna line LAnt, which is a wiring line connecting the coupler CPL to an external connection port PMANT, includes pattern wiring lines routing provided on the dielectric layer PL2 and via electrodes provided in the dielectric layers PL2 to PL21.

A switching line LSw, which is a wiring line that connects the coupler CPL to the switch circuit SW through the matching circuit 2, includes pattern wiring lines provided on the dielectric layers PL2 and PL12 and via electrodes provided in the dielectric layers PL1 to PL11.

Further, a sub-line wiring line Lsub which is a wiring line connected to the sub line 3B of the coupler CPL includes a wiring line provided on the dielectric layer PL2 and via electrodes provided on the dielectric layers PL2 to PL21.

A ground line LGnd configured to secure isolation between the coupler CPL and other devices includes pattern wiring lines provided on the dielectric layer PL3 and via electrodes provided on the dielectric layers PL3 to PL19. The ground line LGnd configured to secure isolation is arranged along the peripheral portions surrounding the openings 17 provided in inner-layer ground electrodes 13A1 and 13A2.

As described above, also in the multilayer substrate 21 of the present example, since the opening (cut-out portion) 17 is provided in each of the inner-layer ground electrodes 13A4 and 13A5 near the chip device that defines and serves as the coupler CPL, coupling between the main line and the sub line of the coupler CPL through the inner-layer ground electrodes 13A4 and 13A5 and coupling between the coupler CPL and other circuit devices are significantly reduced or prevented.

The ground line LGnd is arranged in the peripheral portions surrounding the openings (cut-out portions) 17 using the ground connection via electrodes connecting the inner-layer ground electrode 13A4. As a result, the occurrence of the coupler CPL being coupled to other circuit devices and wiring lines separated from the coupler CPL by the ground line LGnd is significantly reduced or prevented.

Further, the sub-line wiring line Lsub is routed mainly to a predetermined position using a pattern electrode provided on the top surface of the dielectric layer PL2, and includes via electrodes in the other layers. On the other hand, the switching line LSw is routed mainly to a predetermined position on the top surface of the dielectric layer PL12 and includes via electrodes in other layers. The antenna line LAnt includes via electrodes in most of the layers. In other words, the sub-line wiring line Lsub is routed on a layer higher than the inner-layer ground electrode 13A4, and the switching line LSw is routed on a layer lower than the inner-layer ground electrodes 13A4 and 13A5. Hence, the routed portion of the sub-line wiring line Lsub is arranged so as to be considerably separated from the routed portion of the switching line LSw in the stacking direction of the multilayer substrate, with the inner-layer ground electrodes 13A4 and 13A5 therebetween. As a result, the occurrence of coupling between the main line and the sub line of the coupler CPL through the routed portions is significantly reduced or prevented.

Third Preferred Embodiment

Hereinafter, a switch module according to a third preferred embodiment of the present invention will be described with reference to FIG. 3. Note that a block diagram illustrating the circuit configuration of the switch module according to the present preferred embodiment is preferably the same as that of the front-end circuit FEC1 and, hence, description thereof is omitted here. Further, the schematic diagram of the cross-sectional configuration of the switch module according to the present preferred embodiment is preferably the same as that of the switch module 1 according to the first preferred embodiment and, hence, description thereof is omitted here.

Figure 3:
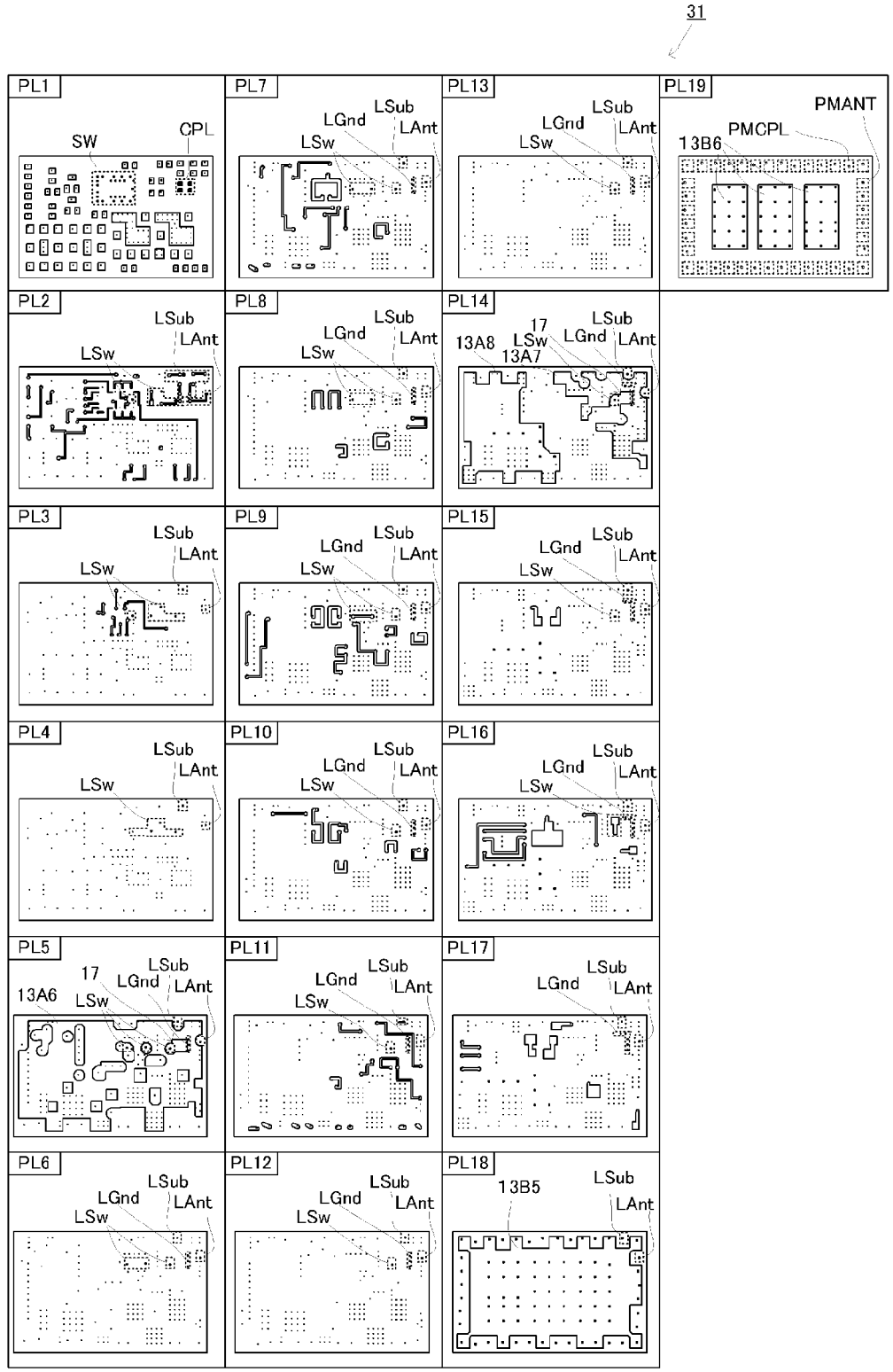
FIG. 3 is a stacking diagram according to an example of a switch module according to a third preferred embodiment of the present invention.

FIG. 3 is a stacking diagram illustrating a multilayer substrate 31 of an example of the switch module according to the third preferred embodiment of the present invention. The multilayer substrate 31 illustrated here preferably includes 19 layers of ceramic layers (dielectric layers) stacked on top of one another. In the multilayer substrate 31, all of the main routing portion of an antenna line LAnt, the main routing portion of a switching line LSw, and the main routing portion of a sub-line wiring line Lsub are arranged on the top surface of the same dielectric layer.

Specifically, a pattern electrode defining a portion of the switching line LSw, a pattern electrode defining a portion of the antenna line LAnt, and a pattern electrode defining a portion of the sub-line wiring line Lsub are provided on the top surface of a dielectric layer PL2 which is located on the second layer of the multilayer substrate 31.

On the top surface of a dielectric layer PL5 which is located on the fifth layer of the multilayer substrate 31, an inner-layer ground electrode 13A6 is provided. On the top surface of a dielectric layer PL14 which is located on the 14th layer of the multilayer substrate 31, inner-layer ground electrodes 13A7 and 13A8 are provided. The inner-layer ground electrode 13A6 and the inner-layer ground electrode 13A7 each include an opening (cut-out portion) 17 located in an area thereof superposed with a chip device that defines and serves as a coupler CPL.

Also in the multilayer substrate 31 having the configuration described above, since the opening 17 is provided in each of the inner-layer ground electrodes 13A6 and 13A7 near the chip device that defines and serves as the coupler CPL, coupling between the main line and the sub line of the coupler CPL through the inner-layer ground electrodes 13A6 and 13A7 and coupling between the coupler CPL and other circuit devices is significantly reduced or prevented.

Further, a ground line LGnd, including ground connection via electrodes that connect the inner-layer ground electrodes 13A6 and 13A7 to each other, is arranged at peripheral portions surrounding the openings (cut-out portions) 17. As a result, the occurrence of the coupler CPL being coupled to other circuit devices separated from the coupler CPL by the ground line LGnd is significantly reduced or prevented.

Fourth Preferred Embodiment

Hereinafter, a switch module according to a fourth preferred embodiment of the present invention will be described with reference to FIG. 4A and FIG. 4B. Note that a block diagram illustrating the circuit configuration of the switch module according to the present preferred embodiment is preferably the same as that of the front-end circuit FEC1 according to the first preferred embodiment and, hence, description thereof is omitted here.

Figure 4A:
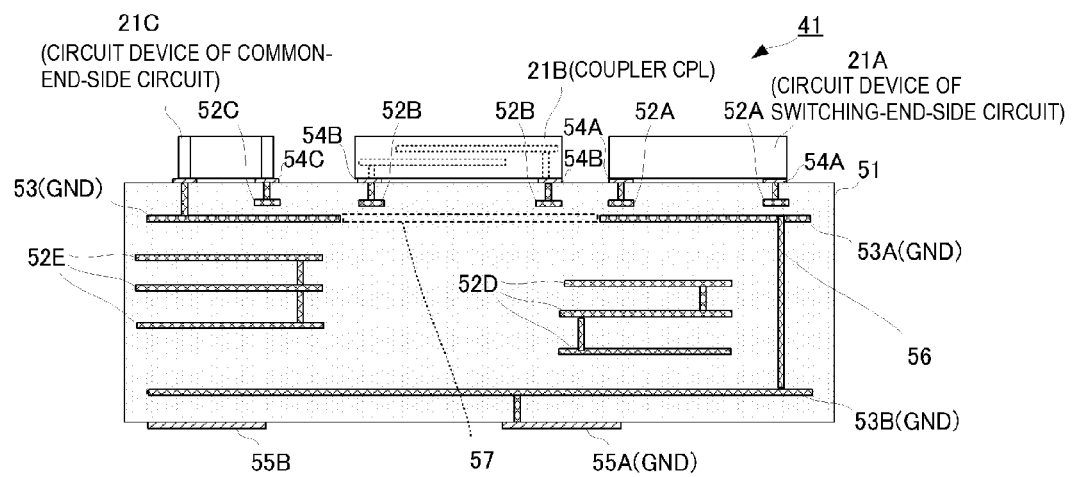
FIG. 4A is a schematic diagram illustrating the cross-sectional structure of a switch module according to a fourth preferred embodiment of the present invention.

FIG. 4A is a schematic diagram illustrating the cross-sectional configuration of the switch module according to the fourth preferred embodiment. A switch module 41 illustrated in FIG. 4A includes a multilayer substrate 51 and chip devices 21A-21C.

The multilayer substrate 51 includes connection wiring lines 52A to 52E, inner-layer ground electrodes 53A and 53B, component mounting electrodes 54A to 54C, external connection electrodes 55A and 55B, and a ground connection via electrode 56. The inner-layer ground electrode 53A includes an opening 57 provided in an area thereof superposed with a chip device 21B that defines and serves as a coupler CPL.

Here, the ground connection via electrode 56 is connected to the inner-layer ground electrode 53A at a location spaced apart from an area surrounding the opening 57. From this location, the ground connection via electrode 56 extends in the stacking direction of the multilayer substrate 51 and is connected to an inner-layer ground electrode 53B.

Figure 4B:
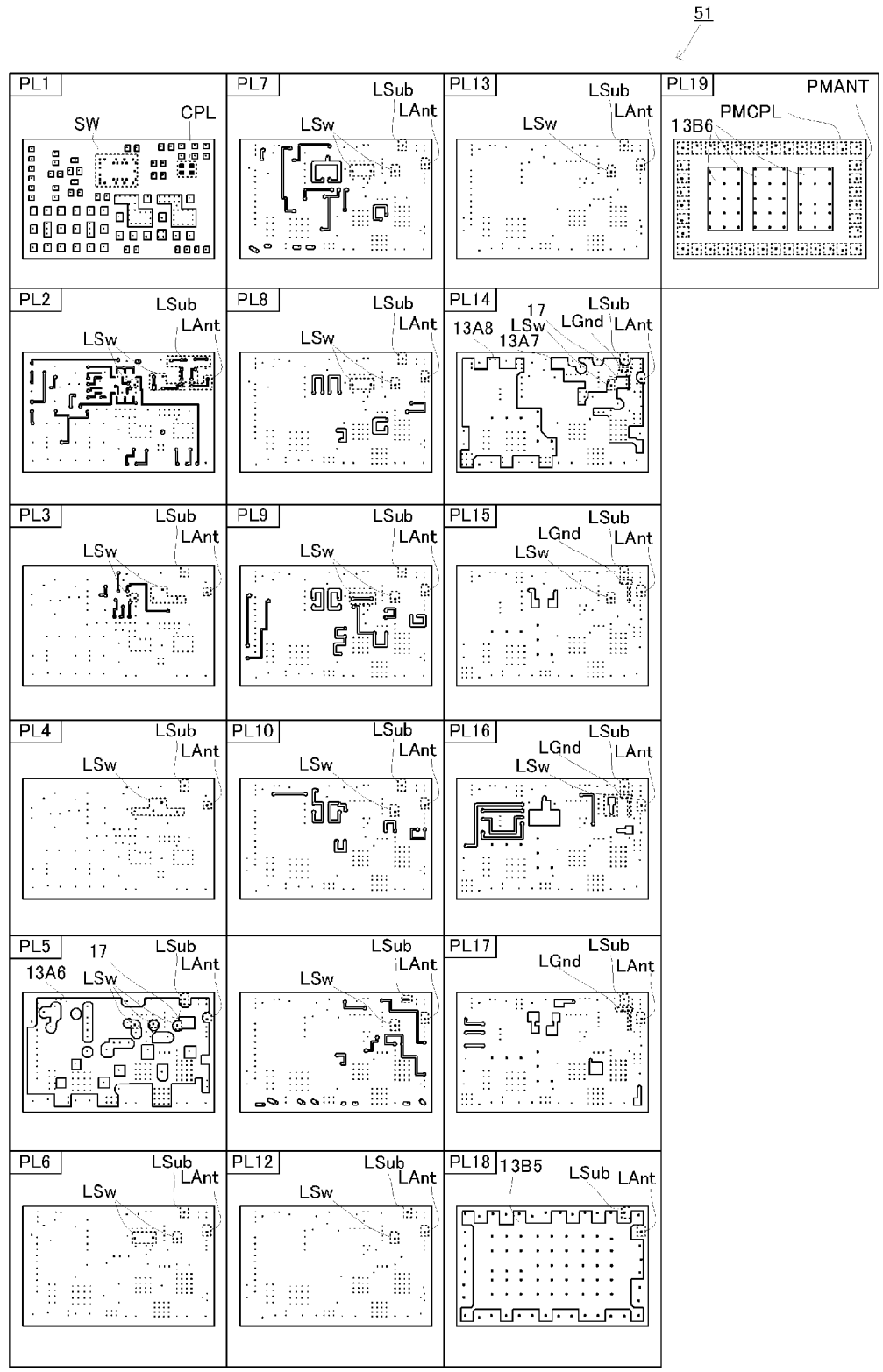
FIG. 4B is a stacking diagram according to an example of the switch module according to the fourth preferred embodiment of the present invention.

FIG. 4B is a stacking diagram of the multilayer substrate 51 according to an example of the switch module according to the fourth preferred embodiment. The multilayer substrate 51 preferably as approximately the same configuration as the multilayer substrate 11 illustrated in the example of the first preferred embodiment described above. However, in this configuration, the ground line (LGnd) configured to secure isolation provided over the dielectric layers PL5 to PL17 is omitted.

Also in the multilayer substrate 51 of the present example, since an opening (cut-out portion) 17 facing a chip device that defines and serves as the coupler CPL is provided in the inner-layer ground electrode 13A6 near the chip device that defines and serves as the coupler CPL, coupling between the main line and the sub line of the coupler CPL through the inner-layer ground electrode 13A6 and coupling between the coupler CPL and other circuit devices are significantly reduced or prevented.

Fifth Preferred Embodiment

Hereinafter, a switch module according to a fifth preferred embodiment of the present invention will be described with reference to FIG. 5. Note that a block diagram illustrating the circuit configuration of the switch module according to the present preferred embodiment is preferably the same as that of the front-end circuit FEC2 according to the second preferred embodiment and, hence, description thereof is omitted here. Further, a schematic diagram illustrating the cross-sectional configuration of the switch module is the same as FIG. 4B, which is the schematic diagram of the switch module 41 according to the fourth preferred embodiment, and, hence, the description thereof is omitted here.

Figure 5:
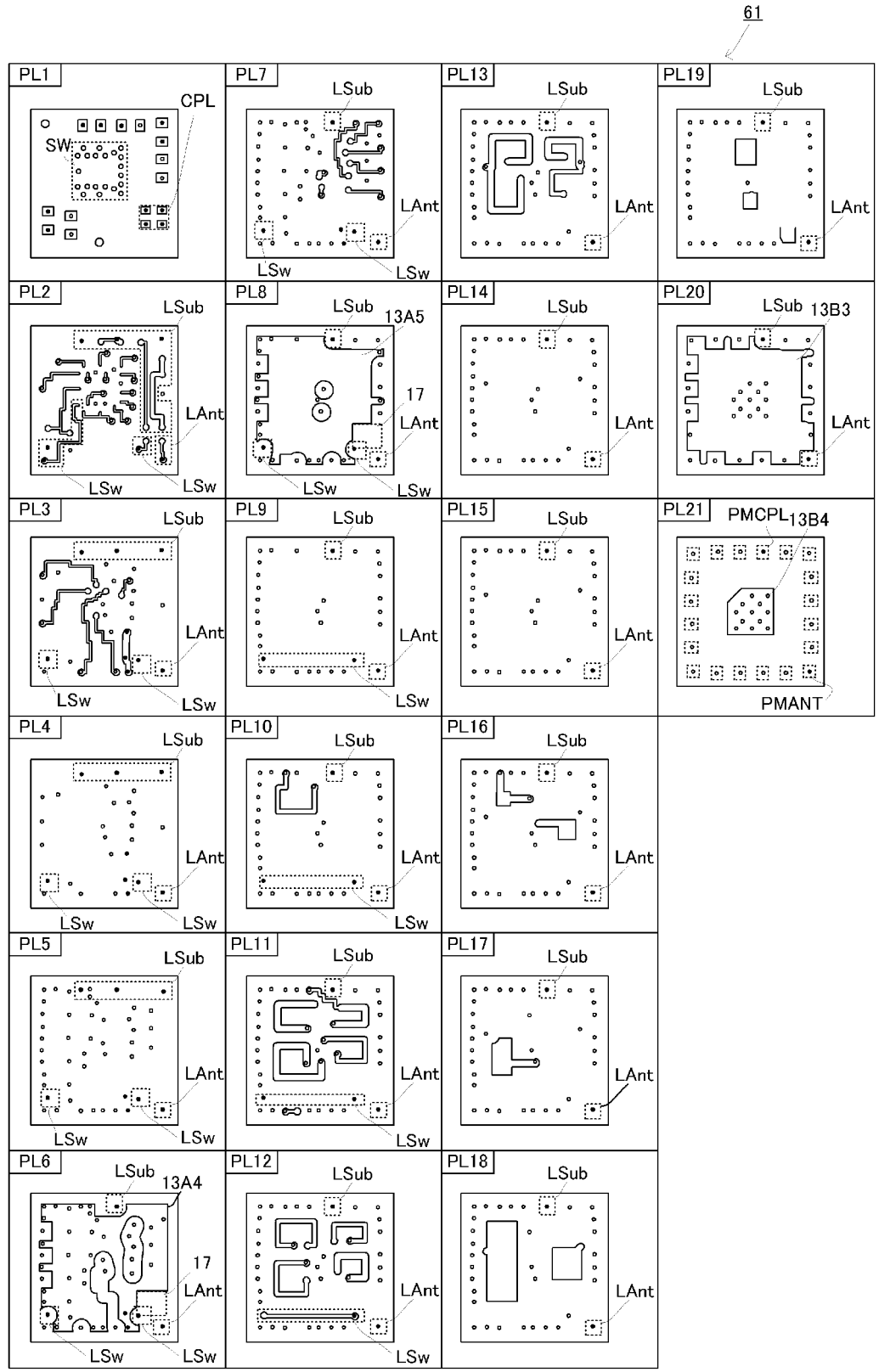
FIG. 5 is a stacking diagram according to an example of a switch module according to a fifth preferred embodiment of the present invention.
Figure 6A:
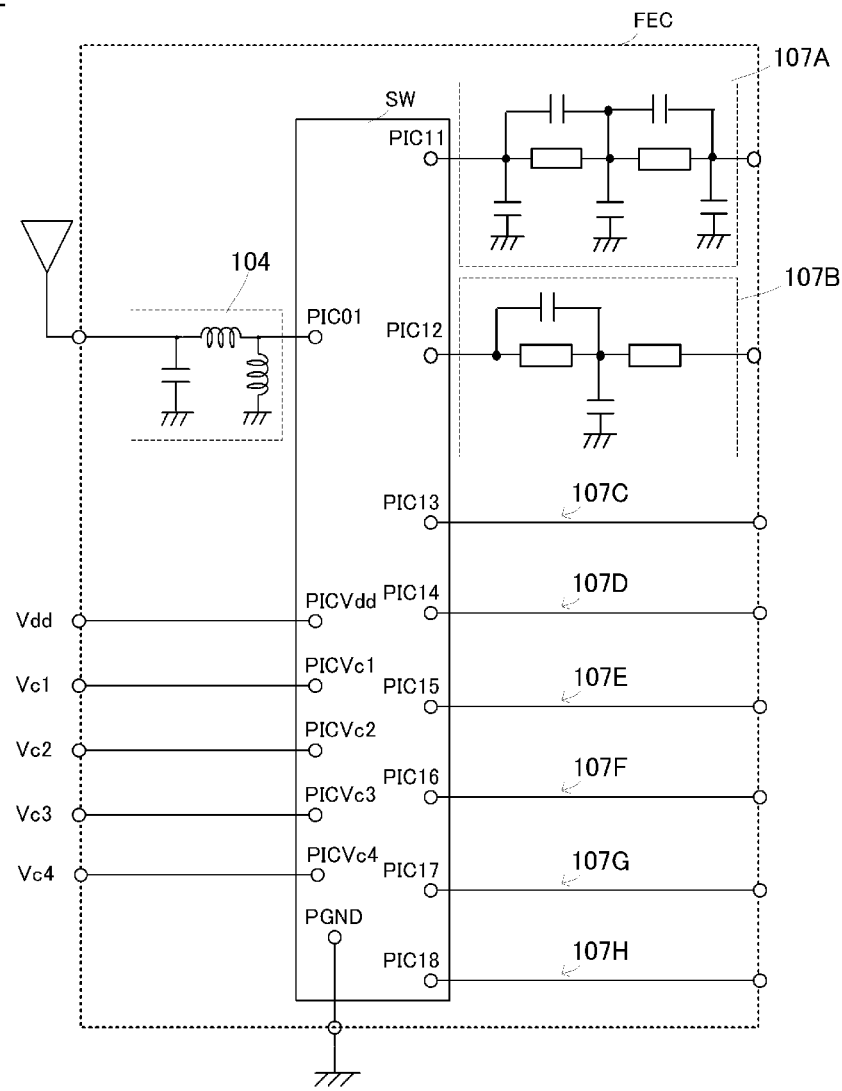
FIG. 6A is a block diagram illustrating a general circuit configuration of a switch module.
Figure 6B:
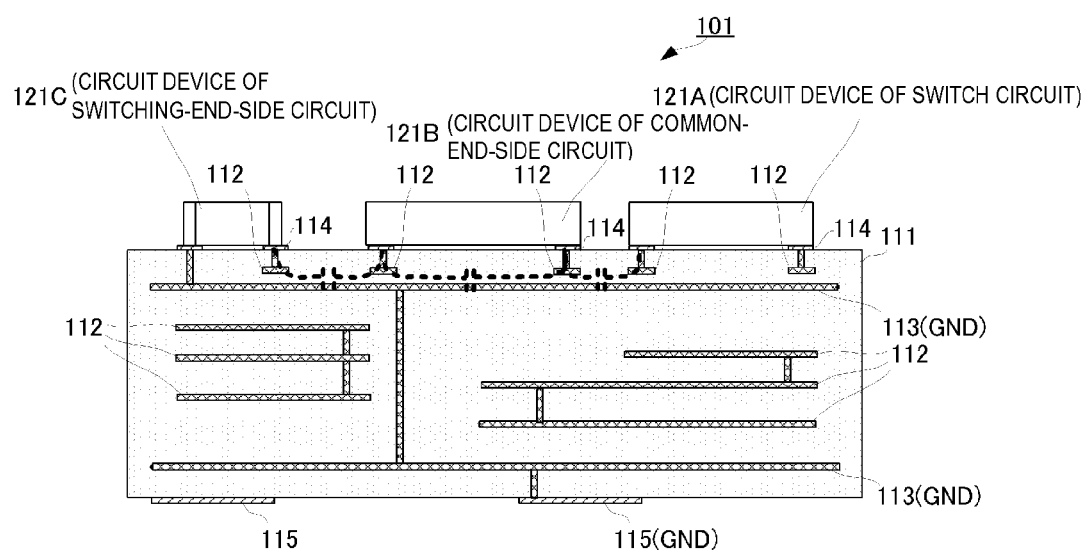
FIG. 6B is a schematic sectional view of an existing configuration example of a switch module.

FIG. 5 is a stacking diagram of a multilayer substrate 61 according to an example of the switching module according to the fifth preferred embodiment. The multilayer substrate 61 preferably has approximately the same configuration as the multilayer substrate 11 illustrated in the example of the second preferred embodiment described above. However, in this configuration, the ground line (LGnd) configured to secure isolation provided over the dielectric layers PL6 to PL19 is omitted.

Also in the multilayer substrate 61 of the present example, since an opening (cut-out portion) 17 facing a chip device that defines and serves as the coupler CPL is provided in each of the inner-layer ground electrodes 13A4 and 13A5 near the chip device that serves as the coupler CPL, the occurrence of coupling between the main line and the sub line of the coupler CPL through the inner layer ground electrodes 13A4 and 13A5 and the occurrence of coupling between the coupler CPL and other circuit devices are significantly reduced or prevented.

The switch modules of the present invention can be configured as described in the above preferred embodiments. In the above description, examples have shown in which the coupler CPL is preferably configured as a chip device and an opening is provided in an inner-layer ground electrode that is closest to the uppermost dielectric layer on which the chip device is mounted. However, not limited to this, a configuration may be used in which the coupler CPL includes electrode patterns provided within the multilayer substrate. In this case, it is preferable that the electrode patterns defining the coupler CPL be provided on a layer within the multilayer substrate and an opening be provided in an inner-layer ground electrode close to the layer. Further, the detailed configuration of the switch module is not limited to those described above. For example, a configuration may be used in which the common-terminal-side circuit includes only a matching circuit without providing a coupler CPL, and an opening is provided in an inner-layer ground electrode close to that matching circuit.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A switch module comprising:
a multilayer substrate including a plurality of dielectric layers and a plurality of electrode layers stacked on top of one another;
a switch circuit that includes a single common terminal and a plurality of switching terminals, and that is configured to be capable of switching a switching terminal to be connected to the common terminal;
a common-terminal-side circuit that is connected to the common terminal and that includes a first circuit device;
switching-terminal-side circuits respectively connected to the switching terminals of the switch circuit; and
inner-layer ground electrodes that are respectively provided on some of the electrode layers and superposed with the switching-terminal-side circuits when viewed in plan in a stacking direction of the multilayer substrate; wherein
an inner-layer ground electrode closest to the first circuit device is not superposed with the first circuit device when viewed in plan in the stacking direction of the multilayer substrate.

2. The switch module according to claim 1, wherein the inner-layer ground electrode closest to the first circuit device includes a cut-out portion or an opening in an area thereof superposed with the first circuit device when viewed in plan in the stacking direction of the multilayer substrate.

3. The switch module according to claim 2, wherein a via electrode connected to the inner-layer ground electrode closest to the first circuit device is arranged in a region of the inner-layer ground electrode closest to the first circuit device, the region surrounding the area superposed with the first circuit device when viewed in plan in the stacking direction of the multilayer substrate.

4. The switch module according to claim 1, wherein the first circuit device is a coupler including a main line and a sub line.

5. The switch module according to claim 4, wherein the via electrode connected to the inner-layer ground electrode is arranged between a wiring electrode connected to the main line and a wiring electrode connected to the sub line.

6. The switch module according to claim 4, wherein the wiring electrode connected to the main line and the wiring electrode connected to the sub line are arranged on different ones of the electrode layers.

7. The switch module according to claim 6, wherein the inner-layer ground electrode is arranged between the electrode layer on which the wiring electrode connected to the main line is provided and the electrode layer on which the wiring electrode connected to the sub line is provided.

8. The switch module according to claim 1, further comprising a second circuit device connected to the first circuit device.

9. The switch module according to claim 8, wherein the second circuit device is a matching circuit.

10. The switch module according to claim 1, wherein the switch module defines a front-end circuit.

11. The switch module according to claim 1, wherein the common-terminal-side circuit includes a matching circuit and a coupler.

12. The switch module according to claim 1, wherein the switching-terminal-side circuits include a transmission filter, a spare circuit, and a duplexer.

13. The switch module according to claim 1, wherein at least one of the switch circuit, the common-terminal-side circuit and the switching-terminal-side circuits is a surface mount component that is surface mounted on a surface of the multilayer substrate.

14. The switch module according to claim 1, wherein each of the switch circuit, the common-terminal-side circuit and the switching-terminal-side circuits is a surface mount component that is surface mounted on a surface of the multilayer substrate.

15. The switch module according to claim 4, wherein each of two of the inner-layer ground electrodes adjacent to the coupler includes a cut-out portion or an opening in an area thereof superposed with the first circuit device when viewed in plan in the stacking direction of the multilayer substrate.

16. The switch module according to claim 15, wherein the coupler is a chip device.

17. The switch module according to claim 4, wherein the coupler is a chip device mounted on the multilayer substrate.

18. The switch module according to claim 4, wherein the coupler includes electrode patterns provided within the multilayer substrate.

* * * * *